(12) United States Patent
Kim

(10) Patent No.: US 10,347,772 B2
(45) Date of Patent: Jul. 9, 2019

(54) ORGANIC LIGHT-EMITTING DISPLAY DEVICE

(71) Applicant: SAMSUNG DISPLAY CO., LTD., Yongin-si, Gyeonggi-do (KR)

(72) Inventor: Jongyun Kim, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 130 days.

(21) Appl. No.: 15/470,119

(22) Filed: Mar. 27, 2017

(65) Prior Publication Data

US 2017/0278917 A1    Sep. 28, 2017

(30) Foreign Application Priority Data

Mar. 28, 2016 (KR) .......................... 10-2016-0036953

(51) Int. Cl.
*H01L 27/12* (2006.01)
*H01L 27/32* (2006.01)
*H01L 29/423* (2006.01)
*H01L 29/786* (2006.01)

(52) U.S. Cl.
CPC .... *H01L 29/78696* (2013.01); *H01L 27/1222* (2013.01); *H01L 27/1255* (2013.01); *H01L 27/1288* (2013.01); *H01L 27/3276* (2013.01); *H01L 29/42372* (2013.01); *H01L 29/42376* (2013.01); *H01L 29/42384* (2013.01); *H01L 29/78621* (2013.01); *H01L 29/78675* (2013.01)

(58) Field of Classification Search
CPC ........... H01L 27/1222; H01L 29/42372; H01L 29/42376; H01L 29/4238; H01L 29/42384; H01L 29/78675; H01L 29/78696

USPC .......................................................... 257/40
See application file for complete search history.

(56) References Cited

U.S. PATENT DOCUMENTS

| | | | |
|---|---|---|---|
| 7,482,628 B2 | 1/2009 | Kang et al. | |
| 7,511,301 B2 | 3/2009 | Kimura | |
| 8,748,898 B2 | 6/2014 | Yamazaki | |
| 2004/0191970 A1* | 9/2004 | Sun | H01L 27/12 438/166 |
| 2008/0048264 A1 | 2/2008 | Seko et al. | |

(Continued)

FOREIGN PATENT DOCUMENTS

| | | |
|---|---|---|
| KR | 10-2004-0060092 | 7/2004 |
| KR | 10-2005-0053000 | 6/2005 |
| KR | 10-1198127 | 10/2012 |

*Primary Examiner* — Matthew E Warren
(74) *Attorney, Agent, or Firm* — Lee & Morse, P.C.

(57) ABSTRACT

A display device includes a switching transistor, a driving transistor, a storage capacitor connected to the switching and driving transistors, and an organic light-emitting diode connected to the driving transistor. The driving transistor is connected to the switching transistor. The driving transistor includes a semiconductor layer having a channel region, first doped regions at sides of the channel region, and second doped regions doped with impurities of a concentration greater than the first doped regions. A first electrode layer is over an insulating layer, which covers the semiconductor layer. The electrode layer includes convex portions extending toward the first doped regions and covering an end of the channel region. At least one of the convex portions has a width greater than or equal to a width of the end of the channel region.

16 Claims, 12 Drawing Sheets

(56) References Cited

U.S. PATENT DOCUMENTS

| | | | |
|---|---|---|---|
| 2009/0173942 A1* | 7/2009 | Hsiao | H01L 29/42384 257/59 |
| 2014/0332761 A1* | 11/2014 | Kim | H01L 27/3262 257/40 |
| 2015/0034909 A1* | 2/2015 | Horch | H01L 27/1156 257/39 |
| 2016/0148981 A1* | 5/2016 | Matsueda | H01L 27/3218 257/40 |
| 2016/0260792 A1* | 9/2016 | Kim | H01L 51/5209 |

* cited by examiner

ORGANIC LIGHT-EMITTING DISPLAY DEVICE

CROSS-REFERENCE TO RELATED APPLICATION

Korean Patent Application No. 10-2016-0036953, filed on Mar. 28, 2016, and entitled, "Organic Light-Emitting Display Device," is incorporated by reference herein in its entirety.

BACKGROUND

1. Field

One or more embodiments relate to an organic light-emitting display device.

2. Description of the Related Art

An organic light-emitting display device includes a plurality of pixels that emit light to form an image. Each pixel includes a pixel circuit, an organic light-emitting diode, and an organic emission layer between two electrodes. The pixel circuit includes thin film transistors and a capacitor for driving the organic light-emitting diode. The transistors include a switching transistor and a driving transistor. In operation, electron and holes injected from the electrodes recombine in the organic emission layer to form excitons. Light is emitted when the excitons change state and release energy.

The gray scale value of light emitted from each pixel may be determined by adjusting the magnitude of a gate voltage Vgs of the driving transistor. The driving range of the driving transistor is based on the gate voltage Vgs, which is related to the channel length of a semiconductor layer of the driving transistor. The semiconductor layer may include polycrystalline silicon or amorphous silicon. Since the electron mobility of polycrystalline silicon is greater than that of amorphous silicon, polycrystalline silicon is generally used.

A polycrystalline silicon transistor has an off-current greater than that of an amorphous silicon transistor. In an attempt to compensate for the greater off-current of the polycrystalline silicon transistor, a lightly doped region may be arranged between heavily doped source and drain regions and a channel region of the polycrystalline silicon transistor.

SUMMARY

In accordance with one or more embodiments, an organic light-emitting display device includes a switching thin film transistor; a driving thin film transistor electrically connected to the switching thin film transistor, the driving thin film transistor including a driving semiconductor layer which includes a driving channel region, first doped regions at sides of the driving channel region, and second doped regions doped with impurities of a concentration greater than the first doped regions; a storage capacitor electrically connected to the switching thin film transistor and the driving thin film transistor; an organic light-emitting diode electrically connected to the driving thin film transistor; a first insulating layer covering the driving semiconductor layer; and a first electrode layer over the first insulating layer, wherein the first electrode layer includes convex portions extending toward each of the first doped regions and covering an end of the driving channel region and wherein at least one of the convex portions has a first width greater than or equal to a width of the end of the driving channel region.

The first width may be less than a second width of the first electrode layer in a same width direction as the first width at a point, and the point may be a midpoint of a channel length of the driving channel region. The driving channel region may be curved. The driving semiconductor layer may include a plurality of curved portions.

The display device may include a second insulating layer overlapping the first electrode layer, a second electrode layer overlapping the first electrode layer, and the second insulating layer is between the first and second electrode layers. The first electrode layer may serve as a driving gate electrode of the driving thin film transistor and as a plate of the storage capacitor. The first electrode layer may include a second convex portion adjacent to at least one of the convex portions, and the at least one convex portion may be spaced from the second convex portion. The second convex portion may extend in a same direction as an extension direction of the at least one convex portion. The at least one convex portion may be spaced apart from the second convex portion in a width direction of the convex portion.

The switching thin film transistor may include a switching channel region, third doped regions at sides of the switching channel region, and fourth doped regions doped with impurities of a concentration greater than the third doped regions. The first doped regions and the third doped regions may include a same material. The length of the switching channel region is less than a length of the driving channel region. The first doped regions may not overlap the convex portions.

In accordance with one or more other embodiments, a semiconductor device includes a first transistor including a semiconductor layer, the semiconductor layer includes first doped regions, a channel region between the first doped regions, and second doped regions doped with impurities of a greater concentration than the first doped regions; an insulating layer covering the semiconductor layer; and an electrode layer over the insulating layer, wherein the electrode layer includes one or more convex portions extending toward the first doped regions, the one or more convex portions covering an end of the channel region, and wherein at least one of the convex portions has a first width greater than or equal to a width of the end of the channel region.

The first width may be less than a second width of the electrode layer in a same width direction as the first width at a point, and the point may be a midpoint of a channel length of the driving channel region. The channel region may be curved. The semiconductor layer may include a plurality of curved portions. The semiconductor device may include a storage capacitor connected to the transistor, wherein the electrode layer serves as a gate electrode of the transistor and a plate of the storage capacitor.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
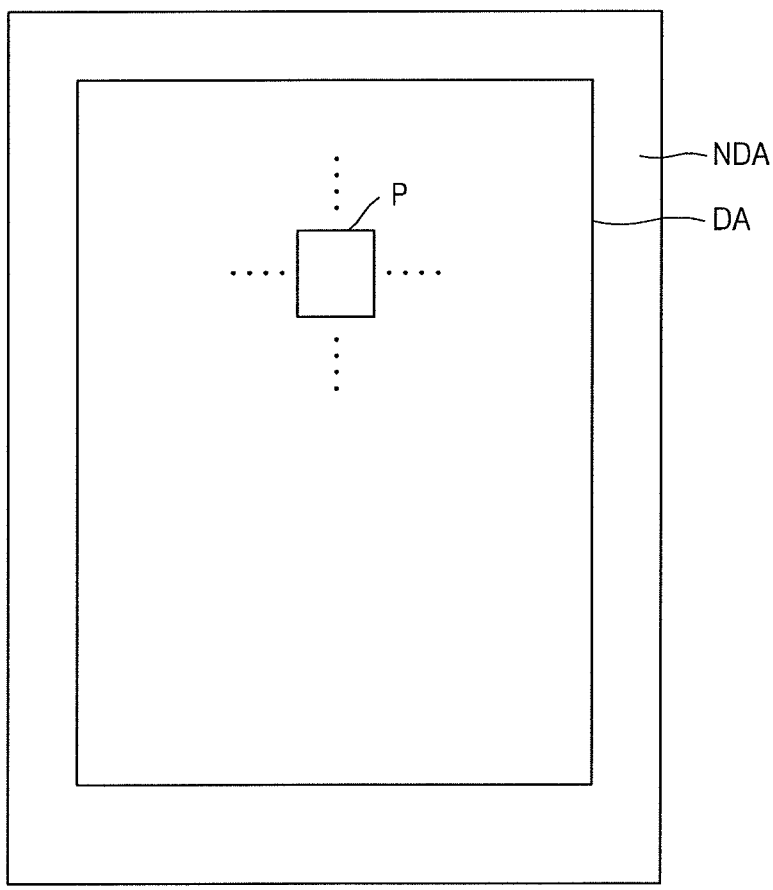
FIG. 1 illustrates an embodiment of an organic light-emitting display device.

Example embodiments are described with reference to the drawings; however, they may be embodied in different forms and should not be construed as limited to the embodiments set forth herein. Rather, these embodiments are provided so that this disclosure will be thorough and complete, and will convey exemplary implementations to those skilled in the art. The embodiments (or portions thereof) may be combined to form additional embodiments.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

When an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

FIG. 1 illustrates an embodiment of an organic light-emitting display device which includes a display area DA (active area) and a non-display area NDA (dead area). The display area DA includes a plurality of pixels P emitting light. Each pixel P emits light of one of a plurality of colors, e.g., red, green, or blue. The non-display area NDA may surround the display area DA and include drivers such as a scan driver and a data driver for transferring a predetermined signal to the pixels P in the display area DA.

Figure 2:
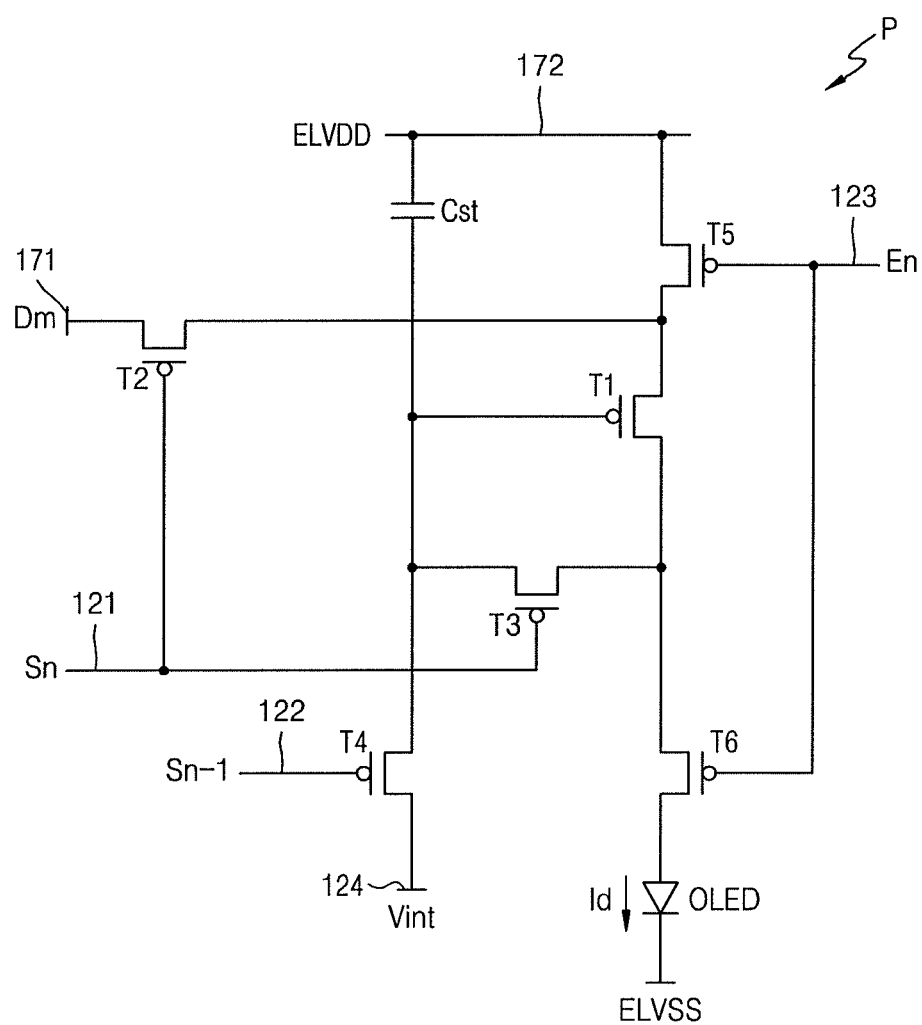
FIG. 2 illustrates an embodiment of a pixel.

FIG. 2 illustrates an embodiment of a pixel P, which may be representative of the pixels in the organic light-emitting display devices of FIG. 1. Referring to FIG. 2, each pixel P includes a pixel circuit for driving an organic light-emitting diode (OLED). The pixel circuit may include at least two thin film transistors and at least one storage capacitor.

Referring to FIG. 2, the transistors may include a driving TFT T1, a switching TFT T2, a compensation TFT T3, an initialization TFT T4, an operation control TFT T5, and an emission control TFT T6. The driving TFT T1 includes a gate electrode connected to one of electrodes of a storage capacitor Cst, a source electrode connected to a driving voltage line 172 via the operation control TFT T5, and a drain electrode is electrically connected to an anode of the OLED via the emission control TFT T6. The driving TFT T1 receives a data signal Dm and supplies a driving current Id to the OLED based on a switching operation of the switching TFT T2.

The switching TFT T2 includes a gate electrode connected to a scan line 121, a source electrode connected to a data line 171, and a drain electrode connected to the source electrode of the driving TFT T1 and simultaneously connected to the driving voltage line 172 via the operation control TFT T5. The switching TFT T2 is turned on based on a scan signal Sn received via the scan line 121 and performs a switching operation of transferring a data signal Dm from the data line 171 to the source electrode of the driving TFT T1.

The compensation TFT T3 includes a gate electrode connected to the scan line 121, a source electrode connected to the drain electrode of the driving TFT T1 and simultaneously connected to the anode of the OLED via the emission control TFT T6, and a drain electrode connected to one of the electrodes of the storage capacitor Cst, a drain electrode of the initialization TFT T4, and the gate electrode of the driving TFT T1 simultaneously. The compensation TFT T3 is turned on based on a scan signal Sn transferred via the scan line 121 and compensates for a threshold voltage of the driving TFT T1 by connecting the gate electrode to the drain electrode of the driving TFT T1, and thus connecting diode-connecting the driving TFT T1.

The initialization TFT T4 includes a gate electrode connected to a previous scan line 122, a source electrode connected to the initialization voltage line 124, and a drain electrode connected to one end Cst1 of the storage capacitor Cst, the drain electrode of the compensation TFT T3, and the gate electrode of the driving TFT T1 simultaneously. The initialization TFT T4 is turned on based on a previous scan signal Sn−1 transferred via the previous scan line 122 and performs an initialization operation of initializing the voltage of the gate electrode of the driving TFT T1, by transferring an initialization voltage Vint to the gate electrode of the driving TFT T1.

The operation control TFT T5 includes a gate electrode connected to an emission control line 123, a source electrode of the operation control TFT T5 is connected to the driving voltage line 172, and a drain electrode of the operation control TFT T5 is connected to the source electrode of the driving TFT T1 and the drain electrode of the switching TFT T2 simultaneously. The operation control TFT T5 is between the driving voltage line 172 and the driving TFT T1. The operation control TFT T5 is turned on based on an emission control signal En from the emission control line 123 and transfers a driving voltage ELVDD to the driving TFT T1.

The emission control TFT T6 includes a gate electrode connected to the emission control line 123, a source electrode of the emission control TFT T6 is connected to the drain electrode of the driving TFT T1 and the source electrode of the compensation TFT T3 simultaneously, and a drain electrode of the emission control TFT T6 is electrically connected to the anode of the OLED. The emission control TFT T6 is between the driving TFT T1 and the OLED. The emission control TFT T6 is turned on based on an emission control signal En from the emission control line 123 and transfers the driving voltage ELVDD from the driving TFT T1 to the OLED.

In the embodiment of FIG. 2, each pixel P includes six TFTs. In one embodiment, each pixel P may include a different number (e.g., seven) of TFTs depending, for example, on the design of the pixel circuit.

The other electrode of storage capacitor Cst is connected to the driving voltage line 172. A cathode of the OLED is connected to a common voltage ELVSS. The OLED emits light based on driving current Id from the driving TFT T1 to display an image.

During an initialization period, when a previous scan signal Sn−1 is supplied from the previous scan line 122, the initialization TFT T4 is turned on based on the previous scan signal Sn−1 and the driving TFT T1 is initialized by the initialization voltage Vint from the initialization voltage line 124.

During a data programming period, when a scan signal Sn is supplied via the scan line 121, the switching TFT T2 and the compensation TFT T3 are turned on based on the scan signal Sn. The driving TFT T1 is then diode-connected and forward-biased by the turned-on compensation TFT T3.

Then, a compensation voltage is applied to the driving gate electrode of the driving TFT T1. The compensation voltage Dm+Vth (Vth has a (−) value) is reduced by a threshold voltage Vth of the driving TFT T1 from a data signal Din supplied from the data line 171. The driving voltage ELVDD and the compensation voltage Dm+Vth are applied to ends of the storage capacitor Cst, and a charge corresponding to a voltage difference between the ends is stored in the storage capacitor Cst.

During an emission period, operation control TFT T5 and emission control TFT T6 are turned on based on an emission control signal En supplied via the emission control line 123. A driving current Id is generated based on the voltage difference between a voltage of the gate electrode of the driving TFT T1 and the driving voltage ELVDD. The driving current Id is supplied to the OLED via emission control TFT T6.

Figure 3:
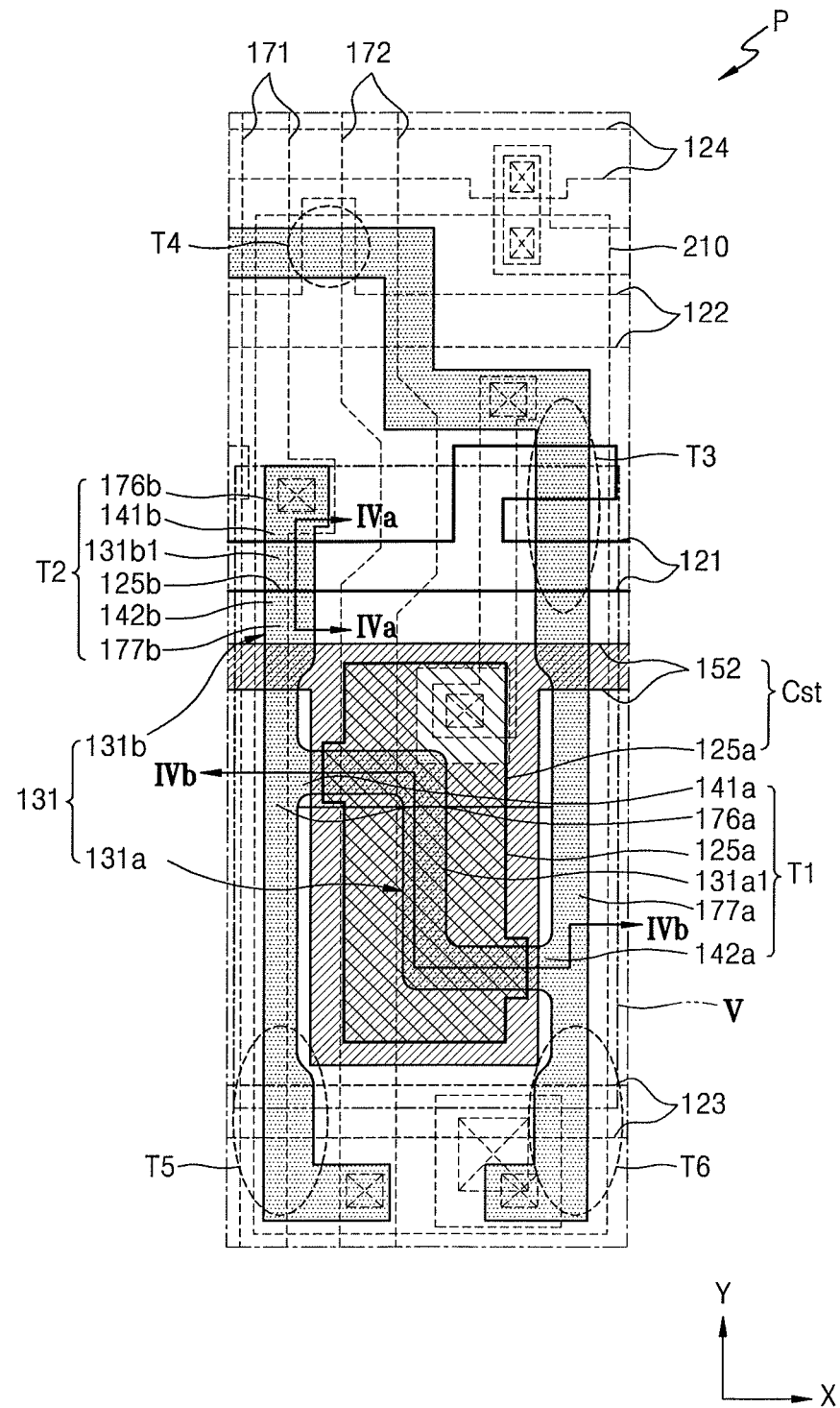
FIG. 3 illustrates a layout view of the pixel.
Figure 4:
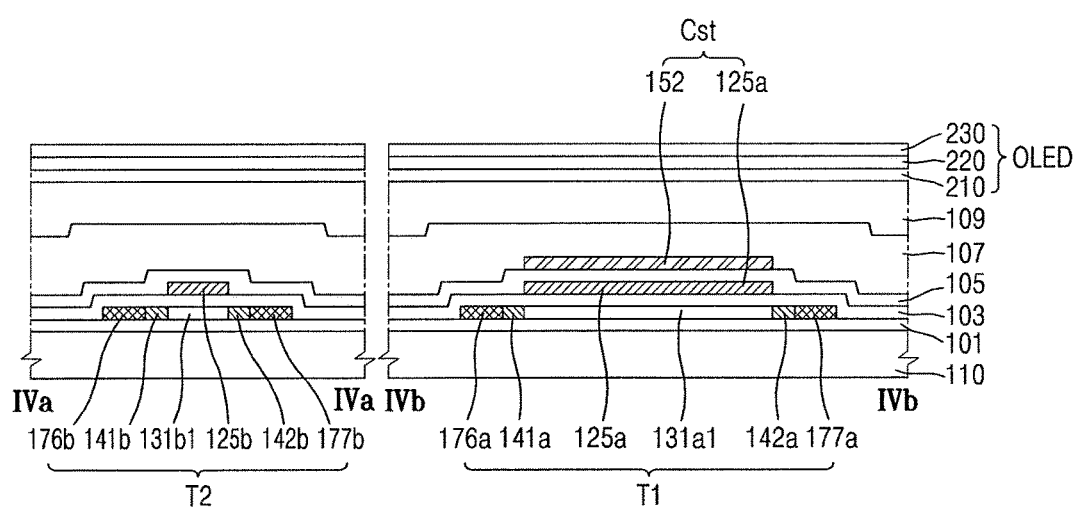
FIG. 4 illustrates cross-sectional views of the pixel.

FIG. 3 illustrates a layout view of a pixel of an organic light-emitting display device, which pixel may correspond to pixel P. FIG. 4 illustrates a cross-sectional view of the pixel P taken along lines IVa-IVa and IVb-IVb of FIG. 3.

Referring to FIG. 3, the pixel P includes the scan line 121, the previous scan line 122, the emission control line 123, and the initial voltage line 124 extending in an X-direction. The data line 171 and the driving voltage line 172 extend in a Y-direction crossing the X-direction. The pixel P includes the driving TFT T1, the switching TFT T2, the compensation TFT T3, the initialization TFT T4, the operation control TFT T5, the emission control TFT T6, and the storage capacitor Cst connected to these lines. Regarding the structure of a pixel P, the driving TFT T1, the switching TFT T2, and the storage capacitor Cst are mainly described according to a stacking order. The structure of the other TFTs may be similar to a stacking structure of the switching TFT.

Referring to FIGS. 3 and 4, a buffer layer 101 is on a substrate 110, which may include a glass material, a metallic material, or a plastic material such as polyethylene terephthalate (PET), polyethylene naphthalate (PEN), polyimide, etc. The buffer layer 101 may include an oxide layer such as SiOx and/or a nitride layer such as SiNx.

The semiconductor layer 131 is on the buffer layer 101. The semiconductor layer 131 may include polycrystalline silicon, a channel region not doped with impurities, and a source region and a drain region doped with impurities in different sides of the channel region. The semiconductor layer 131 may include a lightly doped region doped with impurities of a relatively low concentration between the channel region and the drain region. In another embodiment, the impurities may be different depending, for example, on the kind of TFT. Examples of the impurities include N-type impurities or P-type impurities.

The semiconductor layer 131 includes a driving semiconductor layer 131a of the driving TFT T1 and a switching semiconductor layer 131b of the switching TFT T2. The driving semiconductor layer 131a is connected to switching semiconductor layer 131b.

The driving semiconductor layer 131a includes a driving channel region 131a1 and first doped regions 141a and 142a including first impurities. The first doped regions 141a and 142a are at different sides of the driving channel region 131a1. Second doped regions 176a and 177a include second impurities with a greater concentration than the first impurities. The second doped regions 176a and 177a are at different sides of the driving channel region 131a1, and the first doped regions 141a and 142a are therebetween. The second doped regions 176a and 177a respectively correspond to a source region and a drain region. The source region and the drain region respectively correspond to a source electrode and a drain electrode.

The switching semiconductor layer 131b includes a switching channel region 131b1, third doped regions 141b and 142b including third impurities, the third doped regions 141b and 142b at different sides of the switching channel region 131b1, and fourth doped regions 176b and 177b including fourth impurities with a greater concentration than the third impurities. The fourth doped regions 176b and 177b are at respective sides of the switching channel region 131b1, and the third doped regions 141b and 142b are therebetween.

The driving channel region 131a1 may have a channel length greater than that of the switching channel region 131b1. For example, the driving channel region 131a1 may have a long channel length in a narrow space, achieved by a plurality of curved portions. Since the driving channel region 131a1 is long, the driving range of a gate voltage applied to a first electrode 125a, which is a driving gate electrode, widens. Therefore, the gray scale value of light emitted from the OLED (e.g., FIG. 2) may be more elaborately controlled and display quality may improve by changing the gate voltage magnitude.

The first doped regions 141a and 142a of the driving semiconductor layer 131a and the third doped regions 141b and 142b of the switching semiconductor layer 131b may include the same material. The first doped regions 141a and 142a and the third doped regions 141b and 142b corresponding to lightly doped regions may reduce characteristic deterioration by a hot carrier effect in the driving TFT T1 and the switching TFT T2, respectively.

The second doped regions 176a and 177a of the driving semiconductor layer 131a and the fourth doped regions 176b and 177b of the switching semiconductor layer 131b may include the same material.

A first insulating layer 103 is over substrate 110 and covers the semiconductor layer 131. The first insulating layer 103 may include multiple layers, or a single thin layer, including an organic material and/or an inorganic material including an oxide layer such as SiOx and/or a nitride layer such as SiNx.

A first electrode layer 125a and a switching gate electrode 125b are on the first insulating layer 103. The first electrode layer 125a serves as a driving gate electrode. The switching gate electrode 125b corresponds to a portion of the scan line 122.

The storage capacitor Cst includes the first electrode layer 125a and a second electrode layer 152 which overlap each, and with a second insulating layer 105 therebetween. The first electrode layer 125a serves as a plate of the storage capacitor Cst and the driving gate electrode simultaneously.

The second insulating layer 105 serves as a dielectric, and a storage capacitance is determined based on charge accumulated in the storage capacitor and a voltage between the first and second electrode layers 125a and 152. The second insulating layer 105 may include multiple layers, or a thin layer of a single layer, including an organic material and/or an inorganic material including an oxide layer such as SiOx and/or a nitride layer such as SiNx.

A storage capacitance may be secured, even in high resolution, by allowing the storage capacitor Cst to overlap the driving semiconductor layer 131a in order to secure a region of the storage capacitor Cst, reduced by the driving semiconductor layer 131a having the curved portions.

A third insulating layer 107 and a fourth insulating layer 109 cover the storage capacitor Cst. The data line 171 and the driving voltage line 172, etc., may be between the third and fourth insulating layers 107 and 109.

A pixel electrode 210 is on the fourth insulating layer 109. A pixel-defining layer covers the edge of the pixel electrode 210, exposes the upper surface of the pixel electrode 210, and is over the fourth insulating layer 109. An organic emission layer 220 is on the exposed pixel electrode 210. An opposite electrode 230 is on the organic emission layer 220. The pixel electrode 210 is a reflective electrode including metal. The opposite electrode 230 is a transparent conductive oxide (TCO) such as indium tin oxide (ITO), or a (semi) transparent electrode including a thin film metal including Ag and Mg. For example, the pixel electrode 210 is an anode and the opposite electrode 230 may be a cathode.

The organic emission layer 220 may include a low molecular or polymer organic material. The organic emission layer 220 includes an emission layer and may further include at least one of a hole injection layer (HIL), a hole transport layer (HTL), an electron transport layer (ETL), or an electron injection layer (EIL).

Figure 5:
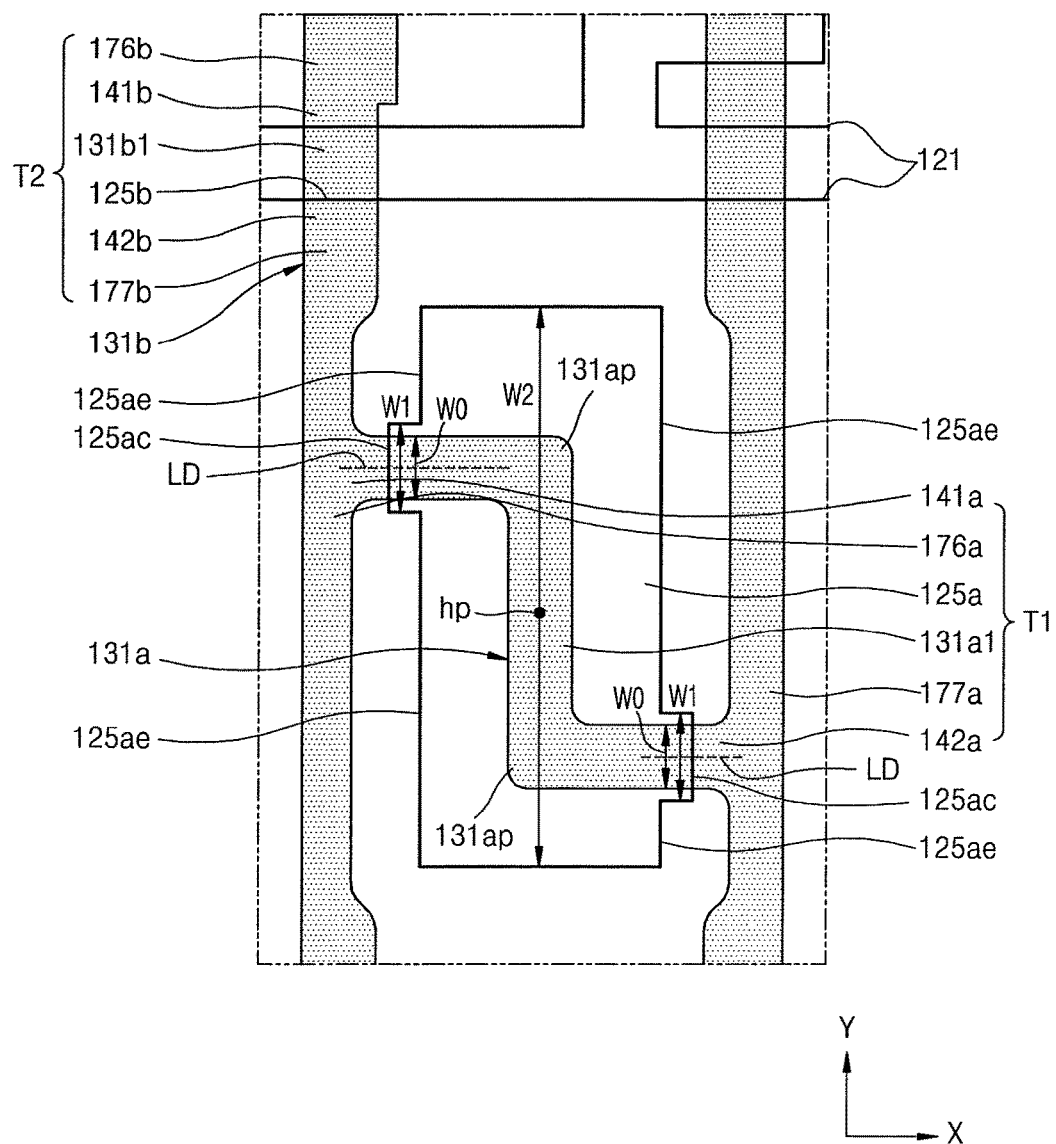
FIG. 5 illustrates a plan view of a portion V in FIG. 3.

FIG. 5 illustrates an embodiment of a portion V in FIG. 3, along with driving TFT T1 and the switching TFT T2 in an organic light-emitting display device. Referring to FIG. 5, the driving semiconductor layer 131a of the driving TFT T1 includes the driving channel region 131a1 having a plurality of curved portions 131ap, the lightly doped first doped regions 141a and 142a, and the heavily doped second doped regions 176a and 177a. The heavily doped second doped regions 176a and 177a correspond to the source region and the drain region.

The first electrode layer 125a overlaps only the driving channel region 131a1 of the driving semiconductor layer 131a. The first electrode layer 125a does not overlap the first and second doped regions 141a, 142a, 176a, and 177a of the driving semiconductor layer 131a. Since the first electrode layer 125a serves as the plate of the storage capacitor as well as the driving gate electrode as described above, the first electrode layer 125a may have a polygonal shape with an area greater than the area of the driving channel region 131a1 in order to secure a storage capacitance. The first electrode layer 125a has a polygonal shape including a convex portion 125ac adjacent to the first doped regions 141a and 142a.

The convex portion 125ac of the first electrode layer 125a covers an end of the driving channel region 131a1 and is adjacent to the first doped regions 141a and 142a. The first electrode layer 125a has the convex portion 125ac extending toward the first doped regions 141a and 142a, and concave portions 125ae (which are relatively concave) arranged at sides of the convex portion 125ac. Therefore, one lateral surface of the first electrode layer 125a (e.g., a lateral surface adjacent to each of the first doped regions 141a and 142a) has unevenness.

A first width W1 of the convex portion 125ac may be equal to or greater than a width W0 of the end of the driving channel region 131a1. The first width W1 may also be less than a second width W2 of the first electrode layer 125a in the width direction of the convex portion 125ac. The second width W2 may correspond, for example, to an imaginary line passing through a point hp (referred to as a half point). The point hp may be at a location that corresponds, for example, to about the midpoint of the channel length of the driving channel region 131a1.

The width direction of the convex portion 125ac may correspond to a direction perpendicular to a length direction LD of the driving channel region 131a1 in the end of the driving channel region 131a1. Since the length direction LD of the driving channel region 131a1 in the end of the driving channel region 131a1 is an X-direction in FIG. 5, the width direction of the convex portion 125ac corresponds to a Y-direction.

The switching semiconductor layer 131b of the switching TFT T2 includes switching channel region 131b1, lightly-doped third regions 141b and 142b, and heavily doped fourth regions 176b and 177b corresponding to the source and drain regions.

The switching gate electrode 125b is a portion of the scan line 121, overlaps the switching channel region 131b1, and does not overlap the third and fourth doped regions 141b, 142b, 176b, and 177b.

As described above, the driving TFT T1 and the switching TFT T2 including lightly-doped regions may be formed by a process corresponding to the first electrode layer 125a and the switching gate electrode 125b.

Figure 6:
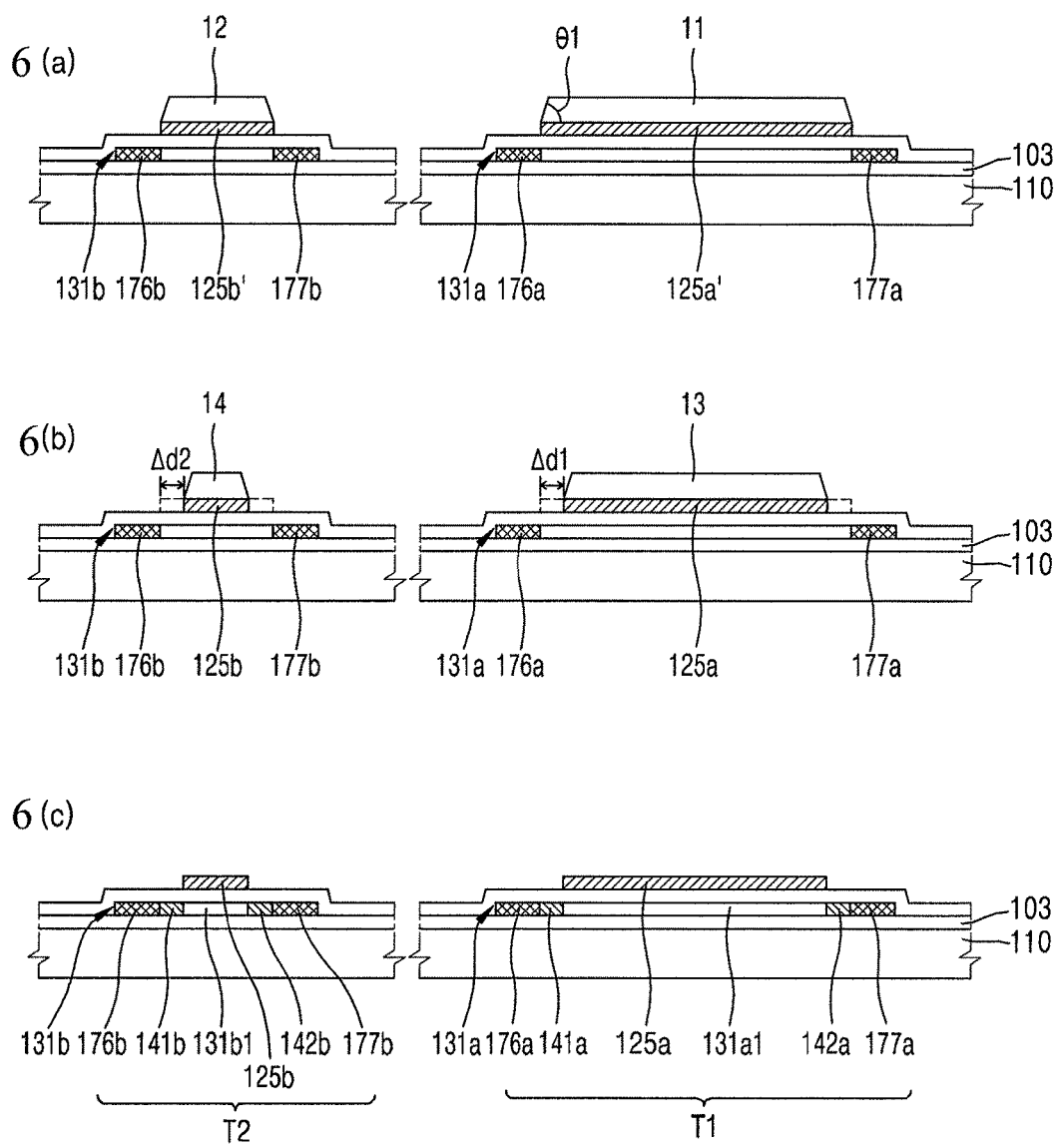
FIGS. 6*a*-6*c* illustrate embodiments of a method for manufacturing a driving thin film transistor and a switching thin film transistor.

FIG. 6 illustrates an embodiment of a process for manufacturing a driving thin film transistor and a switching thin film transistor. For example, in FIG. 6A, the driving semiconductor layer 131a and the switching semiconductor layer 131b are formed, the first insulating layer 103 is formed, and then a metallic layer is formed over the entire surface of substrate 110. Subsequently, a photoresist with a photosensitive characteristic is formed over the metallic layer. Next, first and second photoresist patterns 11 and 12 are formed by arranging a photo mask including a desired pattern and exposing and developing the photo mask. First and second metallic layers 125a' and 125b' are formed by patterning the metallic layer using the first and second photoresist patterns 11 and 12 as a mask. The source and drain regions 176a, 177a, 176b, and 177b are formed by doping with high concentration impurities using first and second metallic layers 125a' and 125b' as a mask.

Next, as illustrated in FIG. 6B, the first and second photoresist patterns 11 and 12 are ashed. The first electrode layer 125a and the switching gate electrode 125b are formed by etching a portion of the first and second metallic layers 125a' and 125b' exposed via the first and second photoresist patterns 13 and 14 after the ashing operation. By this etching, only the area of the first electrode layer 125a is reduced to the same shape as the first metallic layer 125a'. Only the area of the switching gate electrode 125b is reduced to the same shape as the second metallic layer 125b'.

Referring to FIG. 6C, the first and third doped regions 141a, 142a, 141b, and 142b are formed by removing the first and second photoresist patterns 13 and 14 after the ashing and doping with low concentration impurities using the first metallic layer 125a and the switching gate electrode 125b as a mask.

Referring to the above-described process, the length of the first doped regions 141a and 142a, which are lightly doped regions, is determined based on the difference between the width of the first metallic layer 125a' and the width of the first metallic layer 125a. The difference between the width of the first metallic layer 125a' and the width of the first metallic layer 125a is determined based on a reduction amount Δd1 between the width of the first photoresist pattern 13 before ashing and the width of the first photoresist pattern 13 after ashing.

The length of the third doped regions 141b and 142b, which are lightly doped regions, is determined based on the difference between the width of the second metallic layer 125b' and the width of the switching gate electrode 125b. The difference between the width of the second metallic layer 125b' and the width of the switching gate electrode 125b is determined based on a reduction amount Δd2 between the second photoresist pattern 12 before ashing and the second photoresist pattern 14 after ashing.

The reduction amounts Δd1 and Δd2 in the width of the photoresist pattern according to the ashing process are influenced by a lateral tapered angle of the photoresist pattern. The lateral tapered angle of the photoresist pattern is influenced by the area and the shape of a layer below the photoresist pattern.

Figure 11:
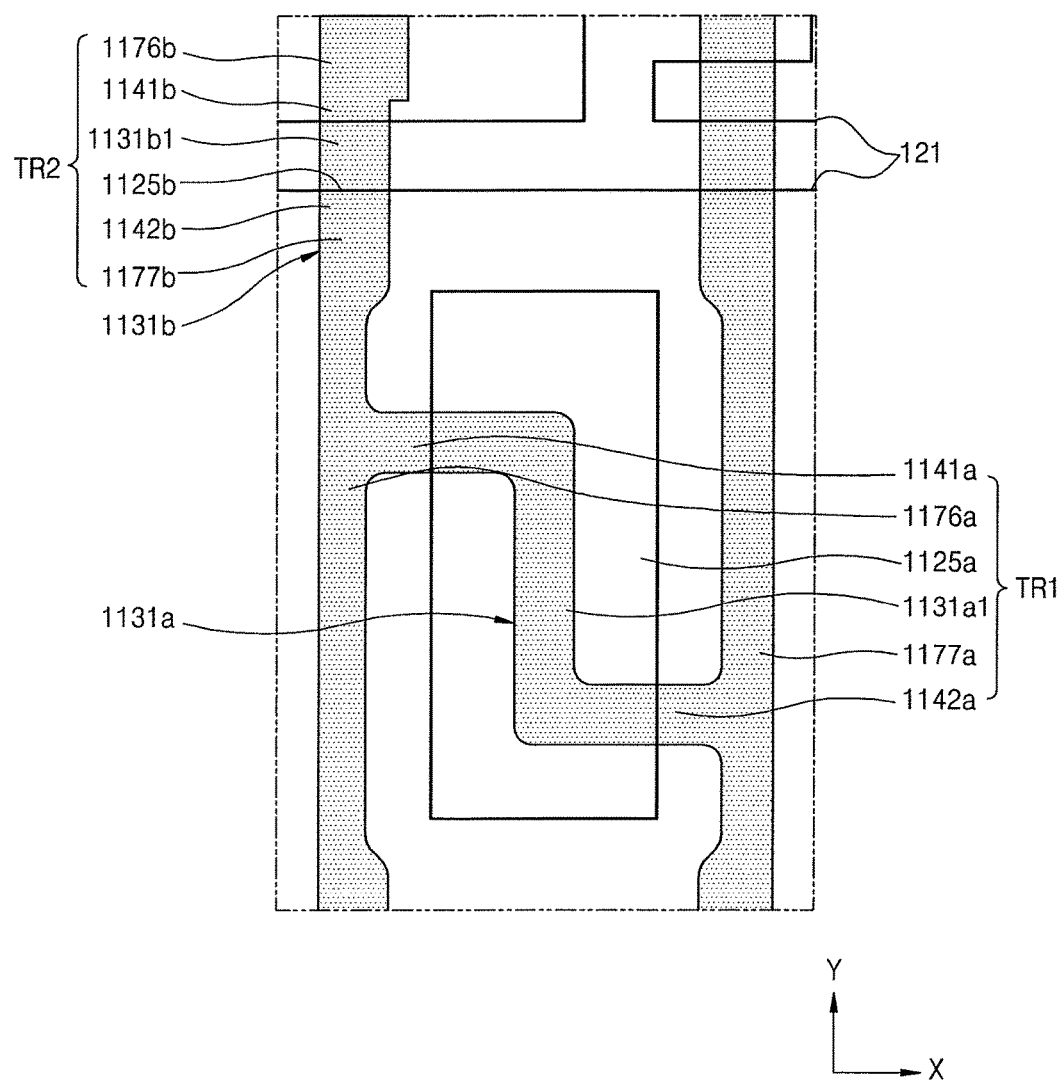
FIG. 11 illustrates a driving thin film transistor and a switching thin film transistor according to a comparative example.
Figure 12:
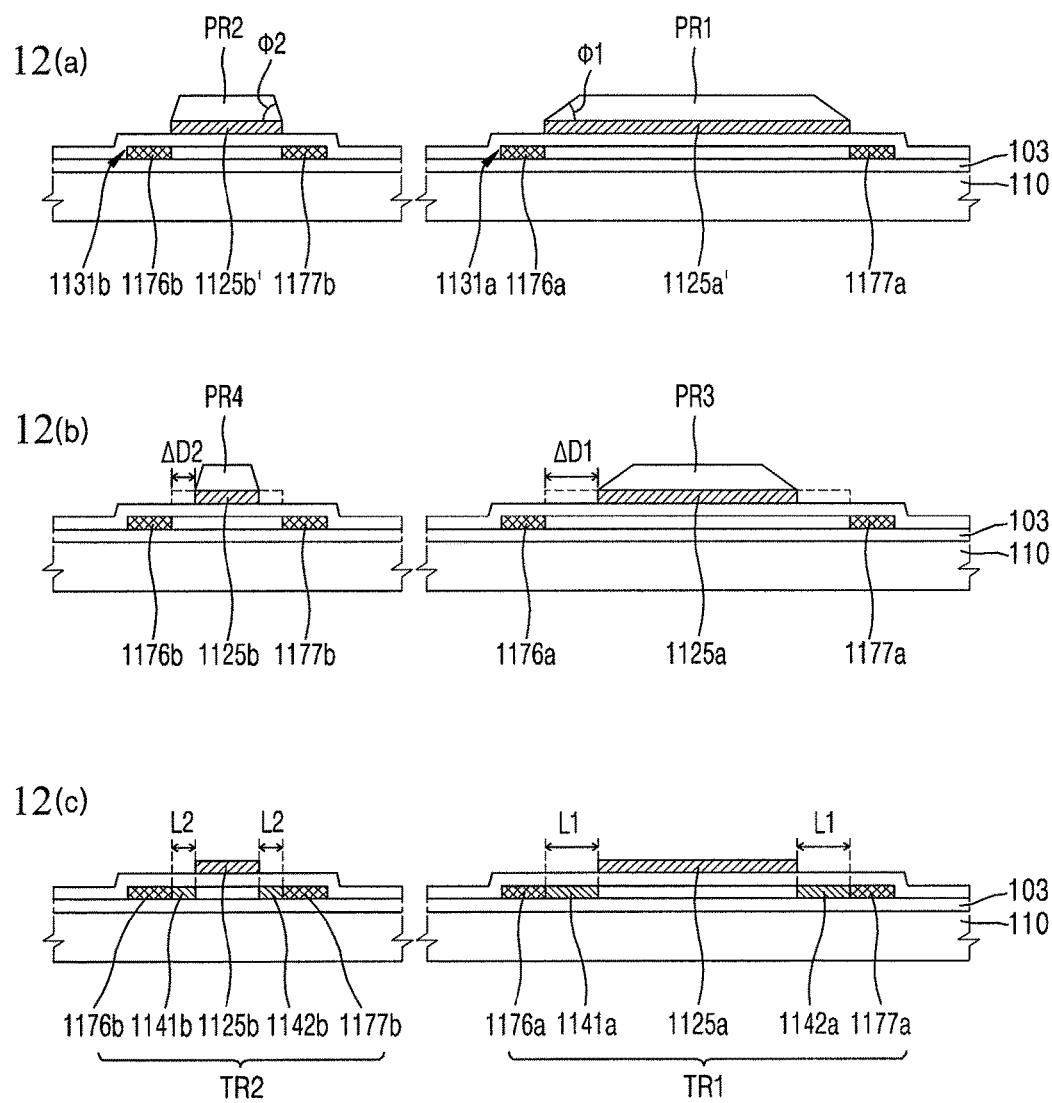
FIGS. 12a-12c illustrate embodiments of a method for manufacturing the driving thin film transistor and the switching thin film transistor of FIG. 11.

FIG. 11 illustrates a driving thin film transistor and a switching thin film transistor of an organic light-emitting display device according to a comparative example. FIG. 12 illustrates a method for manufacturing the driving thin film transistor and the switching thin film transistor of FIG. 11.

Referring to FIG. 11, a driving semiconductor layer 1131a of a driving TFT TR1 includes a driving channel region 1131a1, lightly doped regions 1141a and 1142a, and heavily doped regions 1176a and 1177a. Unlike the first electrode layer 125a described with reference to FIG. 5, a first electrode layer 1125a does not include a convex portion.

A switching TFT TR2 includes a switching semiconductor layer 1131b including a switching channel region 1131b1, lightly doped regions 1141b and 1142b, heavily doped regions 1176b and 1177b, and a switching gate electrode 1125b, which is a portion of the scan line 121. The switching TFT TR2 has the same configuration as the switching TFT T2 described with reference to FIG. 5.

The driving TFT TR1 and the switching TFT TR2 according to the comparative example are manufactured by the same process as the process for manufacturing the driving TFT T1 and the switching TFT T2 of the organic light-emitting display device described with reference to FIGS. 6A to 6C.

Referring to FIG. 12A, a metallic layer is formed and first and second photoresist patterns PR1 and PR2 are formed over the metallic layer by exposing and developing process. First and second metallic layers 1125a' and 1125b' are formed by patterning the metallic layer using the first and second photoresist patterns PR1 and PR2 as a mask. Subsequently, heavily doped regions 1176a, 1177a, 1176b, and 1177b are formed by doping the driving and switching semiconductor layers 1131a and 1131b with high concentration impurities using the first and second metallic layers 1125a' and 1125b' as a mask.

Referring to FIG. 12B, the first and second photoresist patterns PR1 and PR2 are ashed. The first electrode layer 1125a and the switching gate electrode 1125b are formed by etching a portion of the first and second metallic layers 1125a' and 1125b' using first and second photoresist patterns PR3 and PR4 after the ashing operation as a mask. Only the area of the first electrode layer 1125a is reduced to the same shape as the first metallic layer 1125a'. Only the area of the second metallic layer 1125b is reduced to the same shape as the second metallic layer 1125b' by the etching.

Referring to FIG. 12C, lightly doped regions 1141a, 1142a, 1141b, and 1142b are formed by removing the first and second photoresist patterns PR3 and PR4 after ashing, and doping the driving and switching semiconductor layers 1131a and 1131b with low concentration impurities using the first electrode layer 1125a and the switching gate electrode 1125b as a mask.

In the above-described manufacturing process, a lateral tapered angle Φ1 of the first photoresist pattern PR1 on the first metallic layer 1125a' having a relatively large area is less than a lateral tapered angle Φ2 of the second photoresist pattern PR2 on the second metallic layer 1125b' having a relatively small area. Since the lateral tapered angle Φ1 of the first photoresist pattern PR1 on the first metallic layer 1125a' is small, reduction amounts in the widths of the first and second photoresist patterns PR1 and PR2 are different from each other, even when the same ashing process is performed. Thus, the reduction amount ΔD1 in the width of the first photoresist pattern PR1 on the first metallic layer 1125a' is greater than the reduction amount ΔD2 in the width of the second photoresist pattern PR2 on the second metallic layer 1125b'. As a result, the length L1 of the lightly doped regions 1141a and 1142a of the driving TFT TR1 is greater than the length L2 of the lightly doped regions 1141b and 1142b of the switching TFT TR2.

Since the lightly doped regions 1141b and 1142b having the long length increases resistance, they influence the characteristic of the driving TFT TR1 and reduce the resolution of the organic light-emitting display device.

In attempt to resolve this, a method for reducing the area of the first metallic layer 1125a' has been suggested. However, in this case, the area of the first electrode layer 1125a formed by the first metallic layer 1125a' is reduced. Thus, it is difficult to secure a storage capacitance.

In accordance with one or more embodiments, this problem may be solved. For example, the first electrode layer 125a is designed to include the convex portion 125ac adjacent to the first doped regions 141a and 142a, which are lightly doped regions.

As described above with reference to FIG. 5, when the first electrode layer 125a includes the convex portion 125ac with the first width W1 less than the second width W2, a lateral taper angle (e.g., see FIG. 6) of the first photoresist pattern 11 on the first metallic layer 125a' (e.g., see FIG. 6) for forming the first electrode layer 125a is greater than the lateral taper angle Φ1 (e.g., see FIG. 12) of the first photoresist pattern PR1 (e.g., see FIG. 12) according to the comparative example.

Therefore, the reduction amount Δd1 (e.g., see FIG. 6) in the width of the first photoresist pattern 11 by the ashing operation is less than the reduction amount ΔD1 in the width of the first photoresist pattern PR1 according to a comparative example. Thus, the length of the first doped regions 141a and 142a, which are lightly doped regions, of the driving TFT T1 may be reduced. In this case, the length of the first doped regions 141a and 142a may be finely adjusted by changing the first width W1 of the convex portion 125ac (W1<W2).

Figure 7:
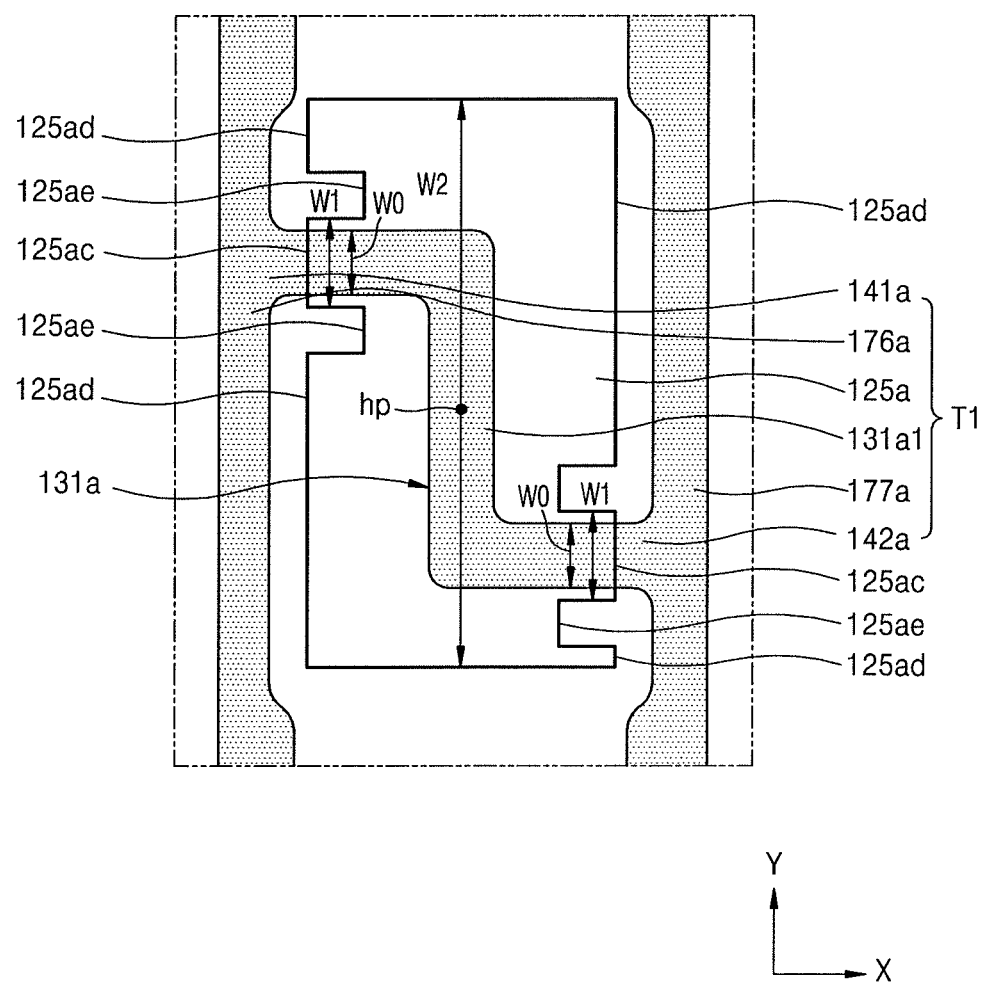
FIG. 7 illustrates another embodiment of a driving thin film transistor.
Figure 8:
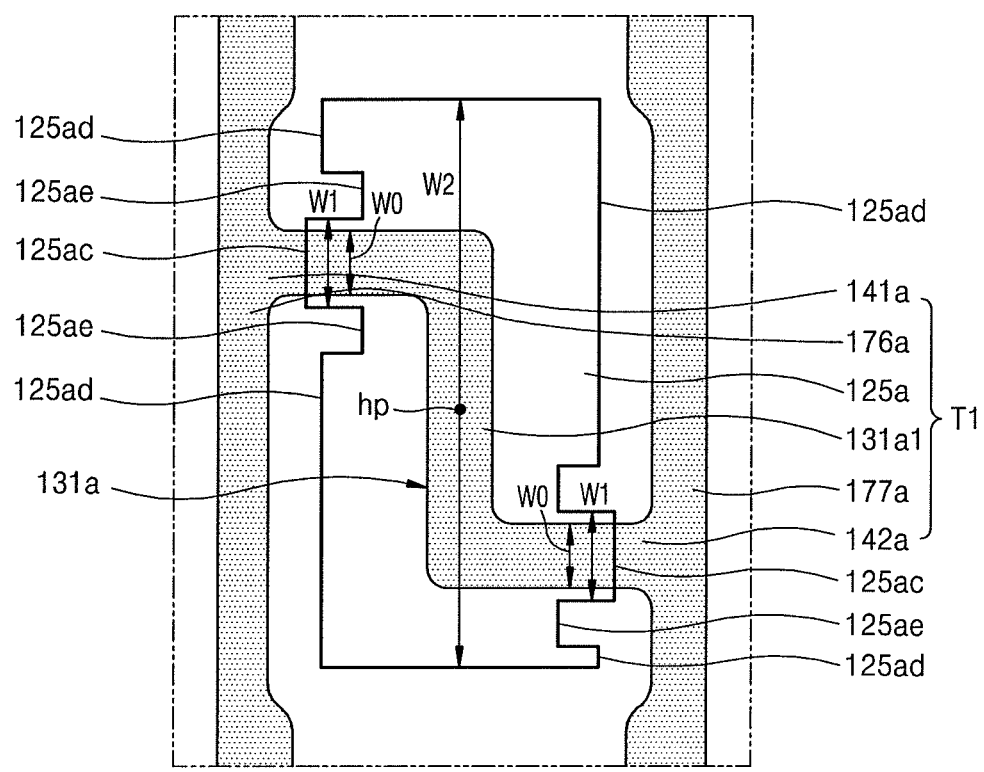
FIG. 8 illustrates another embodiment of a driving thin film transistor.

FIGS. 7 and 8 illustrate other embodiments of a driving thin film transistor of an organic light-emitting display device. The organic light-emitting display devices in FIGS. 7 and 8 may be substantially the same as the organic light-emitting display device in FIG. 5, except the first electrode layer 125a.

Referring to FIGS. 7 and 8, the first electrode layer 125*a* may include the convex portion 125*ac* and a second convex portion 125*ad*. The first width W1 of the convex portion 125*ac* is equal to or greater than the width W0 of the end of the driving channel region 131*a*1. The first width W1 of the convex portion 125*ac* is also less than the second width W2 passing through the half point hp of the driving channel region 131*a*1 in the width direction (e.g. Y-direction) of the convex portion 125*ac*.

Like the convex portion 125*ac*, the second convex portion 125*ad* extends toward the lengthwise direction (e.g. X-direction) of the driving channel region 131*a*1 from the end of the driving channel region 131*a*1. In the embodiment of FIG. 7, the second convex portion 125*ad* may extend such that a short side of the second convex portion 125*ad* is arranged on the same line as a line on which a short side of the convex portion 125*ac* is arranged. In the embodiment of FIG. 8, the second convex portion 125*ad* may extend such that a short side of the second convex portion 125*ad* is arranged on a line different from a line on which a short side of the convex portion 125*ac* is arranged.

The second convex portion 125*ad* is spaced apart by a predetermined interval from the convex portion 125*ac* in the width direction of the convex portion 125*ac*. A concave portion 125*ae* (which is relatively concave) is between the convex portion 125*ac* and the second convex portion 125*ad*. The width of the second convex portion 125*ad* is in the width direction of the convex portion 125*ad* and is less than the second width W2. The lateral side of the first electrode layer 125*a* adjacent to the first doped regions 141*a* and 142*a* has unevenness as a result of the convex portion 125*ac*, second convex portion 125*ad*, and concave portion 125*ae*, which is relatively concave.

As illustrated in FIGS. 7 and 8, when the first electrode layer 125*a* further includes the second convex portion 125*ad*, storage capacitance may advantageously be increased. In FIGS. 7 and 8, the second convex portion 125*ad* is formed at different sides of the convex portion 125*ac*. In one embodiment, the second convex portion 125*ad* may be formed at only one side of the convex portion 125*ac*.

Figure 9:
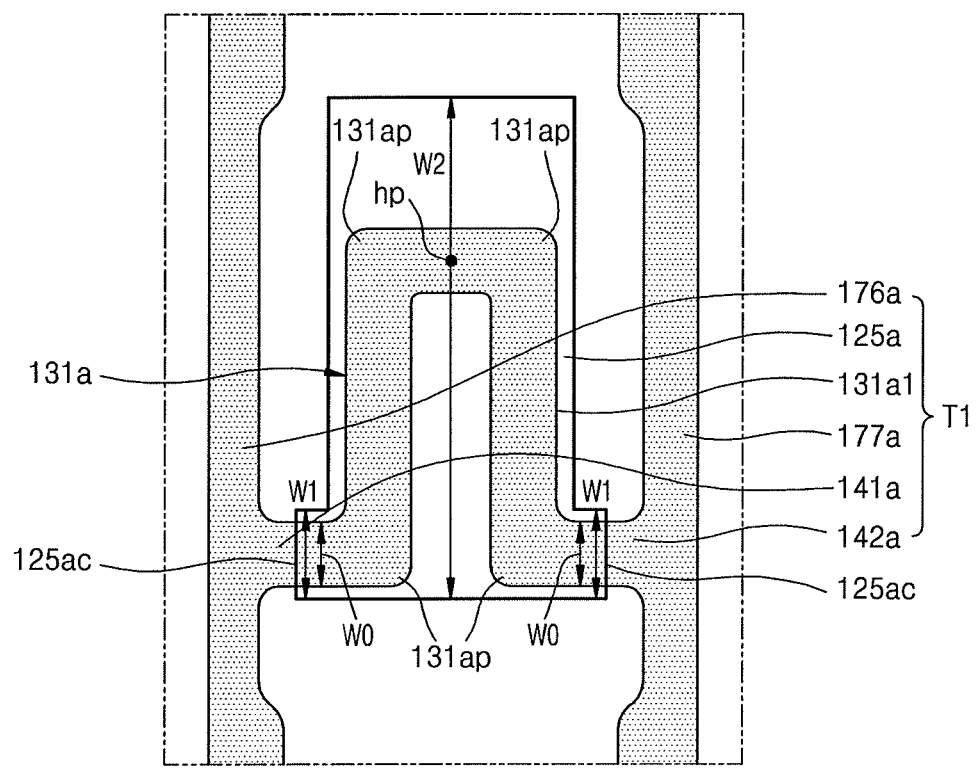
FIG. 9 illustrates another embodiment of a driving thin film transistor.
Figure 10:
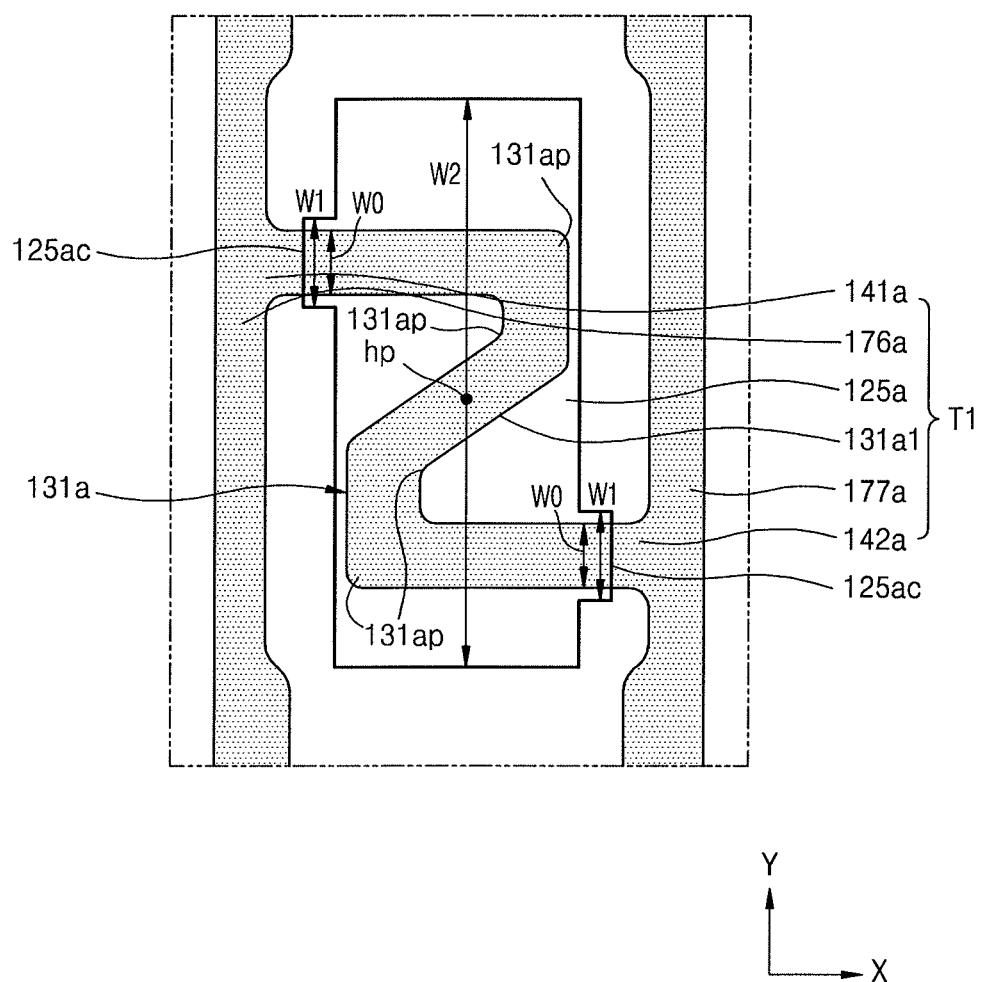
FIG. 10 illustrates another embodiment of a driving thin film transistor.

FIGS. 9 and 10 illustrate other embodiments of a driving thin film transistor of an organic light-emitting display device. The embodiments in FIGS. 9 and 10 are substantially the same as the organic light-emitting display device in FIG. 5, except the driving channel region 131*a*1.

Referring to FIGS. 9 and 10, the first electrode layer 125*a* includes the convex portion 125*ac*. The first width W1 of the convex portion 125*ac* is equal to or greater than the width W0 of the end of the driving channel region 131*a*1 and less than the second width W2 of the first electrode layer 125*ac*, which passes through the half point hp of the driving channel region 131*a*1 in the width direction (e.g. Y-direction) of the convex portion 125*ac*.

The driving channel region 131*a*1 may be curved to have, for example, four curved portions 131*ap*. For example, as illustrated in FIGS. 9 and 10, the curved shape may be an omega ($\Omega$) shape or an alphabet "S" shape. The driving channel region 131*a*1 may have a different curved shape in another embodiment.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light-emitting display device, comprising:
   a switching thin film transistor;
   a driving thin film transistor electrically connected to the switching thin film transistor, the driving thin film transistor including a driving semiconductor layer which includes a curved driving channel region, first doped regions at sides of the curved driving channel region, and second doped regions doped with impurities of a concentration greater than the first doped regions;
   a storage capacitor electrically connected to the switching thin film transistor and the driving thin film transistor;
   an organic light-emitting diode electrically connected to the driving thin film transistor;
   a first insulating layer covering the driving semiconductor layer; and
   a first electrode layer over the first insulating layer, wherein first and second portions of the first electrode layer that overlaps the curved driving channel region respectively extend toward each of the first doped regions and respectively cover each of end portions of the curved driving channel region, and wherein at least one of the first and second portions has a first width greater than or equal to a width of the end portion of the curved driving channel region.

2. The organic light-emitting display device as claimed in claim 1, wherein:
   the first width is less than a second width of the first electrode layer in a same width direction as the first width at a point, and
   the point is a midpoint of a channel length of the curved driving channel region.

3. The organic light-emitting display device as claimed in claim 1, wherein the driving semiconductor layer includes a plurality of curved portions.

4. The organic light-emitting display device as claimed in claim 1, further comprising:
   a second insulating layer overlapping the first electrode layer,
   a second electrode layer overlapping the first electrode layer,
   wherein the second insulating layer is between the first and second electrode layers.

5. The organic light-emitting display device as claimed in claim 1, wherein the first electrode layer serves as a driving gate electrode of the driving thin film transistor and as a plate of the storage capacitor.

6. The organic light-emitting display device as claimed in claim 1, wherein:
   the first electrode layer includes a convex portion adjacent to at least one of the first and second portions, and
   the at least one of the first and second portion is spaced from the convex portion.

7. The organic light-emitting display device as claimed in claim 6, wherein the convex portion extends in a same direction as an extension direction of the at least one of the first and second portions.

8. The organic light-emitting display device as claimed in claim 6, wherein the at least one of the first and second portions is spaced apart from the convex portion in a width direction of the at least one of the first and second portions.

9. The organic light-emitting display device as claimed in claim 1, wherein the switching thin film transistor includes:
   a switching channel region,
   third doped regions at sides of the switching channel region, and
   fourth doped regions doped with impurities of a concentration greater than the third doped regions.

10. The organic light-emitting display device as claimed in claim 9, wherein the first doped regions and the third doped regions include a same material.

11. The organic light-emitting display device as claimed in claim 9, wherein a length of the switching channel region is less than a length of the curved driving channel region.

12. The organic light-emitting display device of claim 1, wherein the first doped regions do not overlap the first and second portions.

13. A semiconductor device, comprising:
   a first transistor including a semiconductor layer, the semiconductor layer includes first doped regions, a curved channel region between the first doped regions, and second doped regions doped with impurities of a greater concentration than the first doped regions;
   an insulating layer covering the semiconductor layer; and
   an electrode layer over the insulating layer, wherein first and second portions of the electrode layer that overlaps the curved channel region respectively extend toward the first doped regions, the first and/or second portions covering an end portion of the curved channel region, and wherein the first and/or second portions have a first width greater than or equal to a width of the end portion of the curved channel region.

14. The semiconductor device as claimed in claim 13, wherein:
   the first width is less than a second width of the electrode layer in a same width direction as the first width at a point, and
   the point is a midpoint of a channel length of the channel region.

15. The semiconductor device as claimed in claim 13, wherein the semiconductor layer includes a plurality of curved portions.

16. The semiconductor device as claimed in claim 13, further comprising:
   a storage capacitor connected to the transistor,
   wherein the electrode layer serves as a gate electrode of the transistor and a plate of the storage capacitor.

* * * * *